United States Patent
Noorizadeh et al.

(10) Patent No.: US 9,455,570 B2
(45) Date of Patent: Sep. 27, 2016

(54) LOW INSERTION LOSS ELECTROSTATIC DISCHARGE (ESD) LIMITER

(71) Applicant: Tektronix, Inc., Beaverton, OR (US)

(72) Inventors: Sahand Noorizadeh, Tigard, OR (US); James D. Pileggi, Beaverton, OR (US); Kyle Grist, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 548 days.

(21) Appl. No.: 13/870,831

(22) Filed: Apr. 25, 2013

(65) Prior Publication Data

US 2014/0321007 A1     Oct. 30, 2014

(51) Int. Cl.
| | |
|---|---|
| *H02H 1/04* | (2006.01) |
| *H02H 9/04* | (2006.01) |
| *H01P 1/14* | (2006.01) |
| *H01L 23/60* | (2006.01) |
| *H01R 24/48* | (2011.01) |

(52) U.S. Cl.
CPC .............. *H02H 9/044* (2013.01); *H01P 1/14* (2013.01); *H01L 23/60* (2013.01); *H01L 2924/0002* (2013.01); *H01R 24/48* (2013.01)

(58) Field of Classification Search
USPC .......................................................... 361/119
See application file for complete search history.

(56) References Cited

U.S. PATENT DOCUMENTS

| | | | | | |
|---|---|---|---|---|---|
| 4,627,104 | A | * | 12/1986 | Knochel | H03D 9/0641 333/246 |
| 4,633,359 | A | * | 12/1986 | Mickelson | H01R 24/48 361/119 |
| 5,216,569 | A | * | 6/1993 | Brookhiser | H01Q 1/50 361/107 |
| 5,477,159 | A | * | 12/1995 | Hamling | G01R 1/06772 324/755.02 |
| 5,490,033 | A | * | 2/1996 | Cronin | H01R 13/6485 361/212 |
| 6,957,047 | B1 | * | 10/2005 | Young | H04B 1/18 455/115.1 |
| 2009/0296292 | A1 | | 12/2009 | Chen et al. | |
| 2010/0296977 | A1 | * | 11/2010 | Hancock | A61L 2/14 422/186 |
| 2011/0089540 | A1 | | 4/2011 | Drost et al. | |
| 2013/0285770 | A1 | * | 10/2013 | Yang | H01P 3/06 333/245 |
| 2014/0321007 | A1 | * | 10/2014 | Noorizadeh | H02H 9/044 361/56 |
| 2015/0171627 | A1 | * | 6/2015 | Holtz | H01H 9/542 361/56 |

FOREIGN PATENT DOCUMENTS

| | | |
|---|---|---|
| JP | 2000068320 A | 3/2000 |
| WO | 95/30258 A1 | 11/1995 |

OTHER PUBLICATIONS

Extended European Search Report for European Patent Application No. 14165982.1 dated Dec. 2, 2014, 6 pages, Munich.

* cited by examiner

*Primary Examiner* — Ronald W Leja

(74) *Attorney, Agent, or Firm* — Marger Johnson

(57) ABSTRACT

An electrostatic discharge (ESD) limiting device for a coaxial transmission line can include an outer housing or shielding, a ground portion positioned within the outer housing, a center pin positioned within the ground portion, and a beam lead device—such as a Schottky diode or other diode—positioned between the ground portion and the center pin and electrically coupled between the ground portion and the center pin. The ESD limiting device may also include one or more spring members mounted on the ground portion to provide elasticity to the device to maintain signal transmission and grounding within the coaxial transmission line.

20 Claims, 4 Drawing Sheets

LOW INSERTION LOSS ELECTROSTATIC DISCHARGE (ESD) LIMITER

TECHNICAL FIELD

The technical field relates generally to electrical transmission devices, and more particularly to electrostatic discharge (ESD) limiting devices for use in connection with coaxial transmission lines.

BACKGROUND

In current connectorized electrostatic discharge (ESD) protection modules or accessories, typical ESD protection devices—such as Schottky diodes—are generally positioned such that they shunt to ground. A common approach involves placing the ESD device on a substrate having a microstrip or co-planar transmission line structure with either end-launch or flange-mount connectors. Among the drawbacks posed by such an approach, however, is the inherent loss due to the change of propagation mode, i.e. from coaxial to either microstrip or co-planar and then back to coaxial. For implementations that require better than ¾ dB of insertion loss and 15 dB of input return loss up to 40 GHz, for example, the loss due to the propagation mode conversion is too high and makes such approaches impractical at best.

A radial attachment method has been attempted for beam lead devices in which a small portion of a coaxial cable is removed to create a flat surface from the center conductor to the outer edge of the shield conductor. Two different means of attaching the beam lead diodes have been employed: conductive epoxy attachment and thermosonic bonding. Among the issues presented by such methods, however, is center pin conductor rotation due to over-torqueing, which would usually cause the beam lead device to break.

Also, subsequent experiments have shown that the electrical properties of the conductive epoxy material are changed after discharging large ESD current through them, thus posing a reliability issue. As for thermosonic bonding, bondable gold surfaces are required. Repeatable and reliable selective gold platting of the surfaces of the exposed plane of the coaxial cable where the bead device(s) needed to be bonded have not yet been achieved at worst and have low yield at best.

Connecting two coaxial transmission lines by means of planar blind mating where the conductive cross sections are pressed and held against each other requires a certain amount of elasticity at the junction in order to allow the expansion and contraction of the coaxial conductors, e.g., due to temperature variation, while maintaining a good connection. There are various ways of adding the compliance to the interface of the coaxial line. These can include integral spring elements such as spring-loaded connectors or adding spring elements to the mating surfaces.

Accordingly, there remains a need for an improved ESD limiting device, particularly with regard to coaxial line transmissions.

SUMMARY

Embodiments of the disclosed technology generally pertain to electrostatic discharge (ESD) modules suitable for implementation within a coaxial transmission line. In certain implementations, an ESD module may include spring-loaded signal and ground pins, and at least one beam lead device, such as a Schottky diode or other suitable diode, electrically coupled between the signal pin and ground portion. Alternative implementations may include multiple beam lead devices. The beam lead device(s) may be radially positioned on the coaxial transmission line. In certain embodiments, one or more spring components may be mounted on the signal conductor and the ground portion to provide elasticity suitable for effectively maintaining the coaxial transmission path during environmental and mechanical stressing.

DETAILED DESCRIPTION

Certain methods for providing electrostatic discharge (ESD) protection with low clamping levels involve the use of Schottky diodes, which have a very fast turn-on response. In sensitive receivers, such limiters may be used in the very first stage of the chain. In order to achieve low loss response at frequencies above 10 GHz, structures having a minimum number of interconnects may be implemented, as well as integrated diode arrays having very small series parasitic capacitance and inductance.

Beam lead stacked Schottky diodes generally satisfy both low parasitics and high dynamic range requirements. To reduce the number of interconnects, beam lead diodes may be mounted radially on a coaxial line connector or middleman having two halves. In certain embodiments, the device may be bonded on one of the halves and pressed and mechanically secured against the other half to form a uniform coaxial line.

Figure 1:
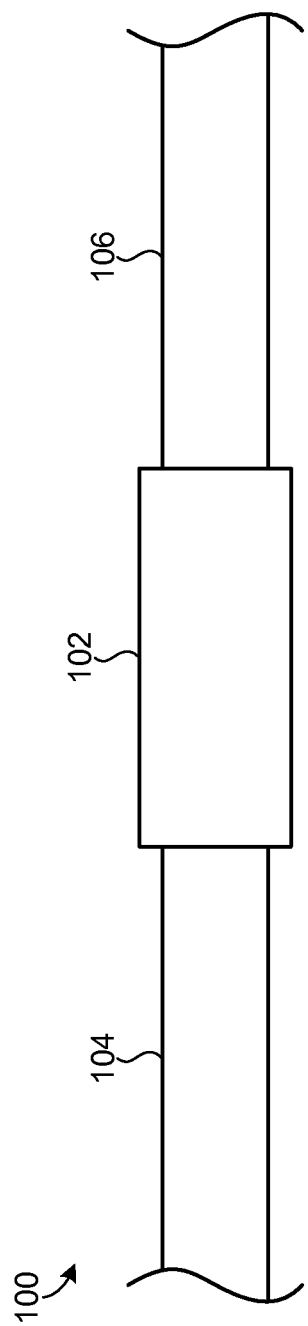
FIG. 1 illustrates an example of an ESD limiting module incorporated within a coaxial transmission line in accordance with certain embodiments of the disclosed technology.

FIG. 1 illustrates an example 100 of an ESD limiting module 102 incorporated within a coaxial transmission line 104, 106 in accordance with certain embodiments of the disclosed technology. In the example 100, the coaxial transmission line, e.g., cable, consists of two separate segments 104 and 106 that are connected together by way of the ESD limiting module 102. In alternative embodiments, the two segments 104 and 106 represent a single coaxial transmission line that has been physically cut or otherwise separated to allow for the ESD limiting module 102 to be inserted therebetween.

Figure 2A:
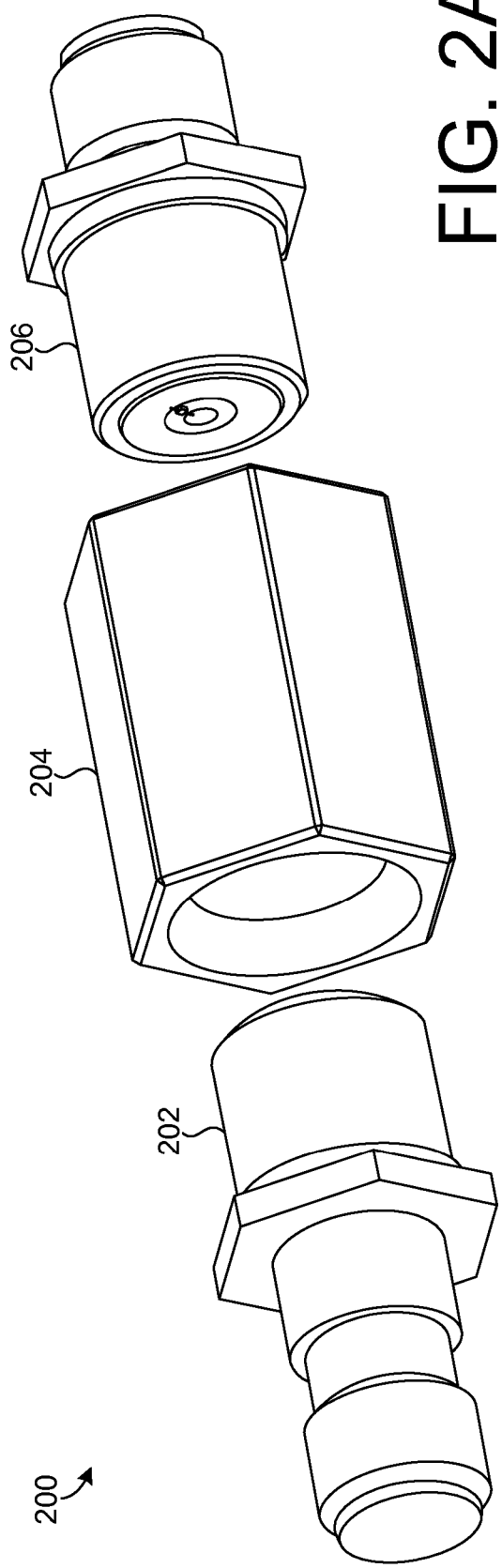
FIG. 2A illustrates a first view of a first example of an ESD limiting module in accordance with certain embodiments of the disclosed technology.

FIG. 2A illustrates a first view of a first example of an ESD limiting module 200 in accordance with certain embodiments of the disclosed technology. The ESD limiting module 200 may be implemented within a coaxial transmission line. In the example, the ESD limiting module 200 includes a first connective component 202, an outer housing component 204 such as an electrical shield, and a second connective component 206. Each of the two connective components 202 and 206 may effectively maintain a coaxial transmission line between two coaxial cables or within a single coaxial cable, for example. Consequently, the ESD limiting module 200 may advantageously maintain a coaxial propagation mode for signals passing therethrough.

Figure 2B:
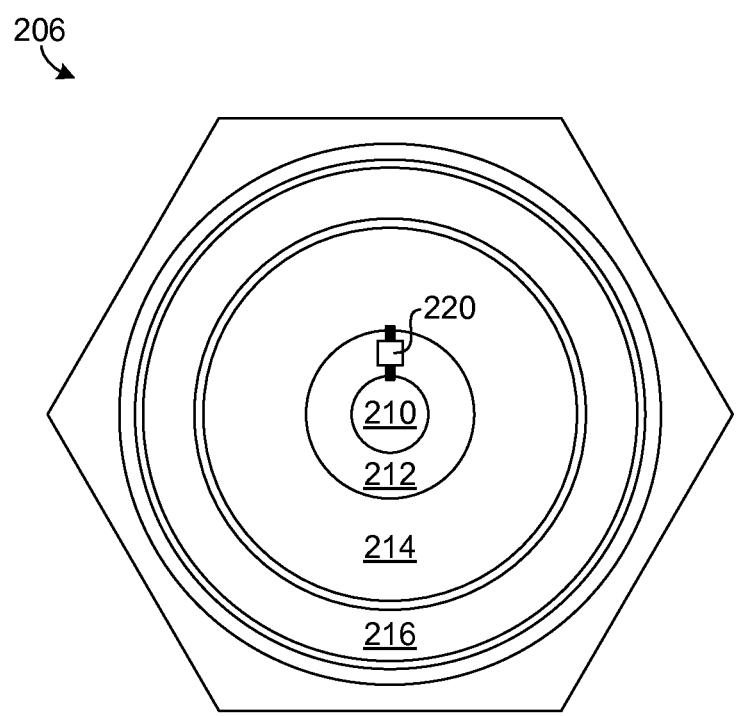
FIG. 2B illustrates a second view of the first example ESD limiting module illustrated by FIG. 2A.

FIG. 2B illustrates a second view of the first example ESD limiting module 200 illustrated by FIG. 2A. In the example, the second connective component 206 includes a spring-loaded signal pin 210, a ground portion 214, and a beam lead device 220 such as a diode, e.g., a Schottky diode or pin diode, positioned radially thereon and coupled electrically between the signal pin 210 and ground portion 214. Each end of the beam lead device 220 may be bonded to the corresponding counterpart, e.g., the signal pin 210 and ground portion 214. A non-conductive dielectric material 212 may be positioned between the signal pin 210 and ground portion 214, and an outer portion 216 may serve to electrically shield or otherwise provide a housing for the ground portion 214.

Alternative implementations may include other diodes in addition to the illustrated beam lead device 220. As the number of beam lead devices increases, however, the bandwidth lowers and, consequently, the module exhibits increased insertion loss. For example, implementations having a single diode may result in a 1-dB bandwidth of 32 GHz whereas implementations having two diodes may result in a bandwidth of 27 GHz.

The spring-loaded signal pin 210 may be composed of virtually any suitable material and have virtually any suitable diameter. The diameter of the signal pin 210 may be varied to provide a particular inductive compensation, for example. The diameter and the length of the signal pin 210 may be optimized through simulation to create a low-pass circuit that compensates for the shunt capacitance of the beam lead device(s) to improve the insertion loss and voltage standing wave ratio (VSWR), for example. Also, a glass bead dielectric may be used to prevent the signal pin 202 from rotating.

Figure 3A:
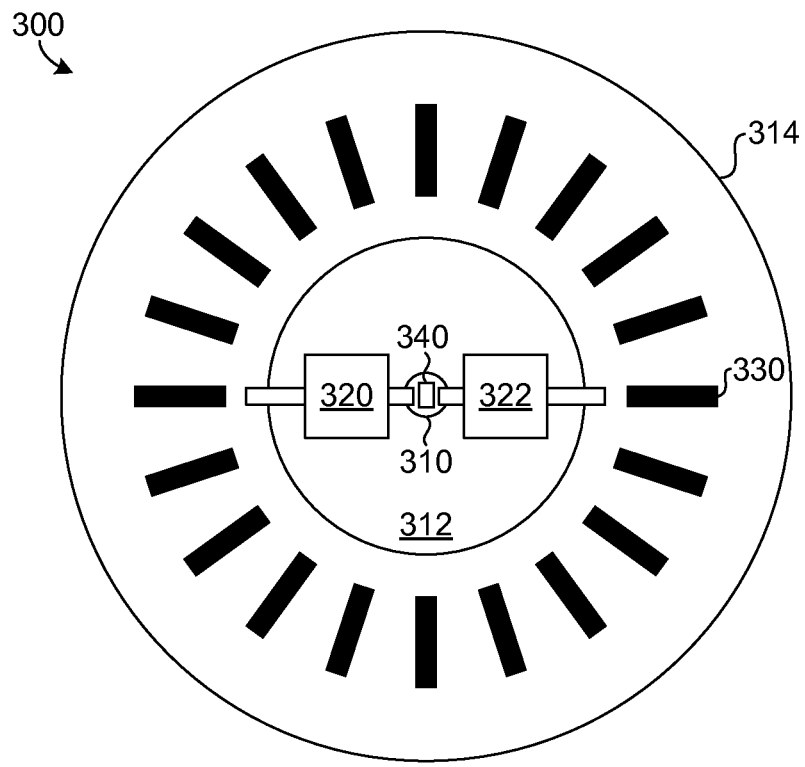
FIG. 3A illustrates a first view of a second example of an ESD limiting module in accordance with certain embodiments of the disclosed technology.

FIG. 3A illustrates a first view of a second example of an ESD limiting module 300 in accordance with certain embodiments of the disclosed technology. The illustrated ESD limiting module 300 is similar to the ESD limiting module 200 illustrated by FIGS. 2A and 2B in that there is a spring-loaded signal pin 310, a ground portion 314, and a dielectric portion 312 therebetween. Unlike the ESD limiting module 200 of FIGS. 2A and 2B, however, the ESD limiting module 300 of FIG. 3A has two beam lead devices 320 and 322 that are each positioned radially on the module 300 and coupled electrically between the signal pin 310 and the ground portion 314.

Figure 3B:
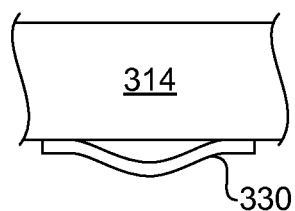
FIG. 3B illustrates a second view of the second example ESD limiting module illustrated by FIG. 3A.

The ESD limiting module 300 of FIG. 3A also includes a plurality of spring components, e.g., 330 and 340. In certain implementations, ribbon bond wire, e.g., one or more bond wire loops, may be used for the miniature spring components, e.g., 330 and 340, in order to maintain a short electrical path, for example. The spring components 330 and 340 may be respectively bonded to the ground portion 314 and signal pin 310, for example, and provide elasticity to the joint of the coaxial transmission line. The spring component 340 on the signal pin 310 may be a folded ribbon bond wire pin. The spring components 330 mounted on the ground plane 314 may also be seen in FIG. 3B, which illustrates a second view of the second example ESD limiting module 300 illustrated by FIG. 3A.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An electrostatic discharge (ESD) limiting device, comprising:
   a ground portion configured to maintain a ground connection within a coaxial transmission line;
   a center pin positioned within the ground portion and configured to maintain a signal connection within the coaxial transmission line;
   a first beam lead device radially positioned on and electrically coupled between the ground portion and the center pin; and
   a second beam lead device radially positioned on and electrically coupled between the ground portion and the center pin.

2. The ESD limiting device of claim 1, wherein the center pin is a spring-loaded signal pin.

3. The ESD limiting device of claim 1, wherein at least one of the first and second beam lead devices comprises a diode.

4. The ESD limiting device of claim 3, wherein the diode is a Schottky diode.

5. The ESD limiting device of claim 3, wherein the diode is a pin diode.

6. The ESD limiting device of claim 1, further comprising an outer housing, wherein the ground portion is positioned within the outer housing.

7. The ESD limiting device of claim 6, wherein the outer housing provides electrical shielding of the ground portion.

8. The ESD limiting device of claim 1, further comprising a glass bead positioned between the ground portion and the center pin.

9. The ESD limiting device of claim 1, wherein the ESD limiting device is a connector.

10. An electrostatic discharge (ESD) limiting device, comprising:
    a ground portion positioned within an outer housing;
    at least one spring component mounted on the ground portion;
    a center pin positioned within the ground portion;
    at least one spring component mounted on the center pin;
    a non-conductive portion positioned between the ground portion and the center pin;
    a first beam lead device radially positioned on and electrically coupled between the ground portion and the center pin; and
    a second beam lead device radially positioned on and electrically coupled between the ground portion and the center pin.

11. The ESD limiting device of claim 10, wherein the at least one spring component mounted on the ground portion is bonded to the ground portion.

12. The ESD limiting device of claim 10, wherein the at least one spring component mounted on the center pin is bonded to the center pin.

13. The ESD limiting device of claim 10, wherein at least one of the first and second beam lead devices includes at least one diode.

14. The ESD limiting device of claim 13, wherein at least one of the diodes is a Schottky diode.

15. The ESD limiting device of claim 13, wherein at least one of the diodes is a pin diode.

16. The ESD limiting device of claim 10, wherein the ESD limiting device has a connector at each end.

17. The ESD limiting device of claim 10, wherein the ESD limiting device is configured to maintain a coaxial transmission line.

18. The ESD limiting device of claim 17, wherein the ESD limiting device is incorporated within a coaxial cable.

19. The ESD limiting device of claim 1, wherein the first and second beam lead devices are positioned substantially opposite each other.

20. The ESD limiting device of claim 10, wherein the first and second beam lead devices are positioned substantially opposite each other.

\* \* \* \* \*